(12) United States Patent
Chu-Kung et al.

(10) Patent No.: US 11,152,290 B2
(45) Date of Patent: Oct. 19, 2021

(54) WIDE BANDGAP GROUP IV SUBFIN TO REDUCE LEAKAGE

(71) Applicant: Intel Corporation, Santa Clara, CA (US)

(72) Inventors: Benjamin Chu-Kung, Portland, OR (US); Van H. Le, Portland, OR (US); Willy Rachmady, Beaverton, OR (US); Matthew V. Metz, Portland, OR (US); Jack T. Kavalieros, Portland, OR (US); Ashish Agrawal, Hillsboro, OR (US); Seung Hoon Sung, Portland, OR (US)

(73) Assignee: Intel Corporatuon, Santa Clara, CA (US)

( * ) Notice: Subject to any disclaimer, the term of this patent is extended or adjusted under 35 U.S.C. 154(b) by 0 days.

(21) Appl. No.: 16/094,817

(22) PCT Filed: Jun. 29, 2016

(86) PCT No.: PCT/US2016/040129
§ 371 (c)(1),
(2) Date: Oct. 18, 2018

(87) PCT Pub. No.: WO2018/004571
PCT Pub. Date: Jan. 4, 2018

(65) Prior Publication Data
US 2019/0122972 A1    Apr. 25, 2019

(51) Int. Cl.
*H01L 23/498*    (2006.01)
*H01L 29/10*    (2006.01)
(Continued)

(52) U.S. Cl.
CPC .... *H01L 23/49816* (2013.01); *H01L 29/1054* (2013.01); *H01L 29/66795* (2013.01); *H01L 29/785* (2013.01)

(58) Field of Classification Search
CPC .......... H01L 23/49816; H01L 29/1054; H01L 29/785; H01L 21/823431;
(Continued)

(56) References Cited

U.S. PATENT DOCUMENTS 9,023,715 B2   5/2015  Faul et al.
9,082,851 B2   7/2015  Ramachandran et al.
(Continued)

FOREIGN PATENT DOCUMENTS

WO   WO-2016099475   6/2016

OTHER PUBLICATIONS

R C Newman, "defects in silicon", Rep Prog physics, vol. 45, 1982, pp. 1163-1210.*
(Continued)

*Primary Examiner* — Cuong B Nguyen
(74) *Attorney, Agent, or Firm* — Schwabe, Williamson & Wyatt, P.C.

(57) ABSTRACT

A subfin layer is deposited on a substrate. A fin layer is deposited on the subfin layer. The subfin layer has a conduction band energy offset relative to the fin layer to prevent a leakage in the subfin layer. In one embodiment, the subfin layer comprises a group IV semiconductor material layer that has a bandgap greater than a bandgap of the fin layer.

17 Claims, 8 Drawing Sheets

(51) Int. Cl.
  *H01L 29/78* (2006.01)
  *H01L 29/66* (2006.01)
(58) Field of Classification Search
  CPC ......... H01L 29/66795–66818; H01L 27/0886; H01L 27/0924
  See application file for complete search history.

(56) References Cited

U.S. PATENT DOCUMENTS

| | | | |
|---|---|---|---|
| 2007/0235763 A1* | 10/2007 | Doyle | H01L 29/785 257/202 |
| 2008/0073667 A1* | 3/2008 | Lochtefeld | H01L 29/7851 257/190 |
| 2011/0147711 A1* | 6/2011 | Pillarisetty | B82Y 10/00 257/24 |
| 2011/0210375 A1 | 9/2011 | Ikeda et al. | |
| 2013/0228832 A1 | 9/2013 | Mieno | |
| 2014/0001519 A1 | 1/2014 | Dewey et al. | |
| 2014/0203327 A1* | 7/2014 | Pillarisetty | H01L 29/78618 257/192 |
| 2016/0056156 A1 | 2/2016 | Ghani et al. | |
| 2016/0149041 A1* | 5/2016 | Holland | H01L 21/76 257/288 |

OTHER PUBLICATIONS

International Search Report and Written Opinion for International Patent Application No. PCT/US2016/040129 dated Mar. 29, 2017, 11 pgs.

International Preliminary Report on Patentability for International Patent Application No. PCT/US2016/040129, dated Jan. 10, 2019, 8 pages.

Office Action from Taiwan Patent Application No. 106116339, dated Apr. 13, 2021, 10 pages.

* cited by examiner

WIDE BANDGAP GROUP IV SUBFIN TO REDUCE LEAKAGE

CROSS-REFERENCE TO RELATED APPLICATION

This patent application is a U.S. National Phase Application under 35 U.S.C. § 371 of International Application No. PCT/US2016/040129, filed Jun. 29, 2016, entitled "WIDE BANDGAP GROUP IV SUBFIN TO REDUCE LEAKAGE," which designates the United States of America, the entire disclosure of which is hereby incorporated by reference in its entirety and for all purposes.

FIELD

Embodiments as described herein relate to a field of electronic device manufacturing, and in particular, to fin based electronic devices manufacturing.

BACKGROUND

Generally, in a fin based transistor architecture (e.g., FinFET, Trigate, Gate-All-Around (GAA)), a transistor channel is surrounded by one or more gates on multiple surfaces that increases electrical control over the channel. Typically, a non-planar transistor has a transistor channel formed on a fin on a substrate.

Typically, in modern integrated circuits silicon is used to build transistors. Silicon, however, has some limitations that may affect the device performance. Many techniques have been developed to manufacture transistors comprising non-Si materials, e.g., Ge, SiGe, or III-V materials on a silicon substrate.

Typically, the parasitic leakage of the fin based transistors is caused by carriers that travel from the source through the fin underneath the gate to the drain. The parasitic subfin leakage degrades the performance of the transistors. The parasitic leakage path from the source to the drain causes increased off-state leakage current, degrades the sub-threshold slope of the current-voltage characteristics and the ability of the transistor to completely turn off.

Currently, to suppress the parasitic leakage in the n-type germanium transistor, the subfin layer is doped with a p-type dopant to form a junction isolation. As the transistors scale down the doping level of the subfin is increased. Increasing the doping level of the subfin layer, however, increases a risk of band-to-band tunneling in which at high electric fields carriers can tunnel from the p-type subfin to the n-type fin. Additionally, increasing the doping level of the subfin layer increases scattering of the carriers from the dopants that reduces the carrier mobility and decreases the device performance.

BRIEF DESCRIPTION OF THE DRAWINGS

Embodiments of the invention may be best understood by referring to the following description and accompanying drawings that are used to illustrate embodiments of the invention.

In the drawings.

DETAILED DESCRIPTION

Figure 1A:
FIG. 1A is a cross-sectional view of an electronic device structure according to one embodiment.

Methods and apparatuses to provide a wide bandgap group IV material subfin to reduce a parasitic electrical current leakage for a fin based transistor are described. In one embodiment, a fin layer is deposited on a subfin layer on a substrate. The subfin layer has a bandgap that is greater than a bandgap of the fin layer. The subfin layer has a conduction band energy offset relative to the fin layer to prevent a parasitic electrical current leakage into the subfin layer of the metal oxide semiconductor (MOS) transistor. In one embodiment, the conduction band energy offset of the subfin layer relative to the fin layer is at least 0.2 electron volts (eV).

In the following description, various aspects of the illustrative implementations will be described using terms commonly employed by those skilled in the art to convey the substance of their work to others skilled in the art. However, it will be apparent to those skilled in the art that embodiments of the present invention may be practiced with only some of the described aspects. For purposes of explanation, specific numbers, materials and configurations are set forth in order to provide a thorough understanding of the illustrative implementations. However, it will be apparent to one skilled in the art that embodiments of the present invention may be practiced without specific details. In other instances, well-known features are omitted or simplified in order not to obscure the illustrative implementations.

Various operations will be described as multiple discrete operations, in turn, in a manner that is most helpful in understanding embodiments of the present invention; however, the order of description should not be construed to imply that these operations are necessarily order dependent. In particular, these operations need not be performed in the order of presentation.

While certain exemplary embodiments are described and shown in the accompanying drawings, it is to be understood that such embodiments are merely illustrative and not restrictive, and that the embodiments are not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment. Thus, the appearance of the phrases, such as "one embodiment" and "an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment. While the exemplary embodiments have been described herein, those skilled in the art will recognize that these exemplary embodiments can be practiced with modification and alteration as described herein. The description is thus to be regarded as illustrative rather than limiting.

FIG. 1A is a cross-sectional view of an electronic device structure 100 according to one embodiment. A buffer layer 102 is deposited on a substrate 101, as shown in FIG. 1A. In an embodiment, the substrate 101 comprises a semiconductor material, e.g., silicon (Si). In one embodiment, substrate 101 is a monocrystalline Si substrate. In another embodiment, substrate 101 is a polycrystalline silicon substrate. In yet another embodiment, substrate 101 is an amorphous silicon substrate. In alternative embodiments, substrate 101 includes silicon, germanium ("Ge"), silicon germanium ("SiGe"), a III-V materials based material e.g., gallium arsenide ("GaAs"), or any combination thereof.

In an embodiment, substrate 101 is a semiconductor-on-isolator (all) substrate including a bulk lower substrate, a middle insulation layer, and a top monocrystalline layer. The top monocrystalline layer may comprise any material listed above, e.g., silicon. In various implementations, the substrate can be, e.g., an organic, a ceramic, a glass, or a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of embodiments of the present invention.

In one embodiment, substrate 101 includes one or more metallization interconnect layers for integrated circuits. In at least some embodiments, the substrate 101 includes interconnects, for example, vias, configured to connect the metallization layers. In at least some embodiments, the substrate 101 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing.

The buffer layer 102 is deposited to accommodate for a lattice mismatch between the substrate 101 and one or more layers above the buffer layer 102 and to confine lattice dislocations and defects. In an embodiment, buffer layer 102 has a lattice parameter between the lattice parameter of the substrate 101 and a subfin layer which is formed thereon. Generally, a lattice constant is a lattice parameter that is typically referred as a distance between unit cells in a crystal lattice. Lattice parameter is a measure of the structural compatibility between different materials. In one embodiment, the buffer layer 102 has a graded bandgap that gradually changes from the interface with the substrate 101 to the interface with a subfin layer. In various embodiments the buffer layer 102 may have different numbers of layers or simply be a single layer.

In one embodiment, the buffer layer 102 comprises a group IV material layer. Generally, the group IV material refers to a semiconductor material composed of one or more elements of the group IV of the periodic table, e.g., carbon (C), silicon (Si), germanium (Ge), tin (Sn), lead (Pb), or any combination thereof. In one embodiment, buffer layer 102 comprises a germanium layer. In one embodiment, buffer layer 102 comprises a silicon germanium (SiGe) layer. In one embodiment, the buffer layer 102 is a $Si_xGe_{1-x}$ layer, where x gradually decreases from 1 at the interface with the Si substrate to 0 at the interface with the above germanium containing subfin layer. In an embodiment, substrate 101 is a silicon substrate, and buffer layer 104 is a group IV material layer, e.g., a germanium layer, silicon germanium layer, or any combination thereof. In another embodiment, buffer layer 102 comprises a III-V material layer. Generally, the III-V material refers to a compound semiconductor material that comprises at least one of group III elements of the periodic table, e.g., boron ("B"), aluminum ("Al"), gallium ("Ga"), indium ("In"), and at least one of group V elements of the periodic table, e.g., nitrogen ("N"), phosphorus ("P"), arsenic ("As"), antimony ("Sb"), bismuth ("Bi"). In an embodiment, buffer layer 102 comprises InP, GaAs, InGaAs, InAlAs, other III-V material, or any combination thereof.

In one embodiment, buffer layer 102 has the sufficient thickness that most defects present at its bottom surface are not present at its top surface. In one embodiment, the thickness of the buffer layer 102 is at least about 50 nanometers ("nm"). In one embodiment, the thickness of the buffer layer 102 is from about 50 nm to about 5 microns (μm), or other thickness.

In at least some embodiments, buffer layer 102 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other deposition techniques known to one of ordinary skill in the art of microelectronic device manufacturing.

Figure 1B:
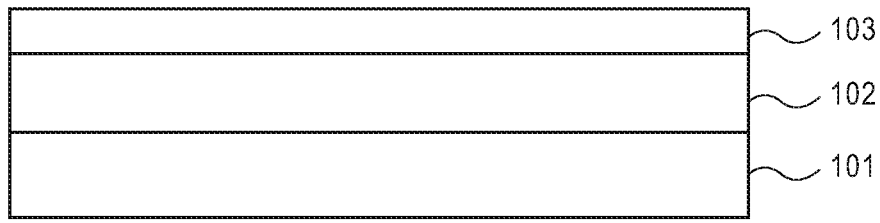
FIG. 1B is a view similar to FIG. 1A after a subfin layer is deposited on a buffer layer according to one embodiment.

FIG. 1B is a view 110 similar to FIG. 1A after a subfin layer 103 is deposited on buffer layer 102 according to one embodiment. In some embodiments, device structure 100 lacks buffer layer 102, and subfin layer 103 is deposited directly onto the substrate 101. In one embodiment, subfin layer 103 has a conduction band energy offset relative to the fin layer which is deposited thereon to cut-off a parasitic electrical current leakage, as described in further detail below. In one embodiment, subfin layer 103 has a bandgap between a conduction band and a valence band that is greater than that of the fin layer 104, as described in further detail below.

Generally, the valence band and conduction band refer to the energy bands that determine the electrical conductivity of the semiconductor material. Typically, a valence band refers to the highest range of electron energies in which electrons are normally present at absolute zero temperature and the conduction band refers to the lowest range of vacant electronic states. A conduction band offset refers to a relative alignment of the conduction energy bands at an interface between two dissimilar semiconductors, as described in further detail below.

In one embodiment, the subfin layer 103 is a group IV semiconductor material layer. Generally, the group IV semiconductor material comprises one or more elements of the group IV of the periodic table, e.g., carbon, silicon (Si), germanium (Ge), tin (Sn), lead (Pb) (e.g., gray tin, α-Sn, or other tin), flerovium (Fl), or any combination thereof.

In one embodiment, the subfin layer 103 comprises carbon (C). In one embodiment, the subfin layer 103 comprises silicon germanium carbon (SiGeC), silicon carbide (e.g., SiC, 3C—SiC), or any combination thereof. In one embodiment, the subfin layer 103 comprises a carbon doped SiGe. In one embodiment, the subfin layer 103 comprises a $Si_{1-x-y} Ge_x C_y$ alloy. In one specific embodiment, the subfin layer 103 is a $Si_{1-x-y} Ge_x C_y$ alloy, where x is any number from 0 to 1; and y is greater than about 0.01, so that the subfin layer 103 can be SiC or GeC. In more specific embodiment, the subfin layer 103 is a $Si_{1-x-y} Ge_x C_y$ alloy, where x is from about 0.7 to about 0.9; and y is from about 0.01 to about 0.03.

In one embodiment carbon is added to the subfin layer of SiGe to increase the conduction band energy offset relative to the fin layer of Ge or SiGe. In one embodiment, the carbon content in the subfin layer is such that a conduction band energy offset relative to the fin layer is sufficient to prevent electrons from travelling into the subfin layer to create a parasitic electrical current leakage in the fin underneath a gate of the transistor, as described in further detail below.

In one embodiment, the subfin layer 103 comprises at least 1 weight percent (wt %) of carbon. In one embodiment, the subfin layer 103 comprises from about 1 wt % to about 5 wt % of carbon. In one embodiment, the carbon content of the $Si_{1-x-y} Ge_x C_y$ of the subfin layer 103 increases from a first carbon content at the interface with the buffer layer 102 to a second carbon content at the interface with the fin layer deposited on the subfin layer 103 later on in a process. In one embodiment, the $Si_{1-x-y} Ge_x C_y$ of the subfin layer 103 has about 2 wt % of carbon at least at the interface with the fin layer that is deposited on the subfin layer 103.

In another embodiment, the subfin layer 103 comprises a III-V material. In alternative embodiments, the subfin layer 103 comprises a binary III-V material, e.g. gallium arsenide (GaAs), gallium phosphide (GaP), aluminum arsenide (AlAs), aluminum phosphide (AlP), a ternary material III-V, e.g. aluminum arsenic antimonide (AlAsSb), indium gallium arsenide (InGaAs), a quaternary III-V material, e.g. aluminum gallium indium phosphide (AlInGaP) or other III-V material alloys.

In one embodiment, the thickness of the subfin layer 103 is sufficient enough to prevent tunneling of the electrical current carriers (e.g., electrons, holes) through the subfin layer 103. In one embodiment, the greater the conduction band energy offset of the subfin layer 103 relative to the fin layer deposited thereon the smaller the thickness of the subfin layer 103. In one embodiment, the thickness of the subfin layer 103 is at least about 5 nanometers (nm). In one embodiment, the thickness of the subfin layer 103 is from about 5 nm to about 200 nm. In more specific embodiment, the thickness of the subfin layer 103 is from about 10 nm to about 20 nm.

In an embodiment, subfin layer 103 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other deposition techniques known to one of ordinary skill in the art of microelectronic device manufacturing.

Figure 1C:
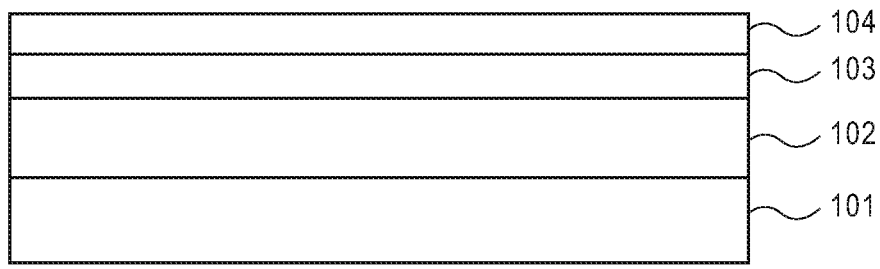
FIG. 1C is a view similar to FIG. 1B after a fin layer is deposited on the subfin layer according to one embodiment.

FIG. 1C is a view 120 similar to FIG. 1B after a fin layer 104 is deposited on the subfin layer 103 according to one embodiment. In one embodiment, subfin layer 103 has a conduction band energy offset relative to the fin layer 104 to prevent a parasitic electrical current leakage into the subfin layer 103.

Figure 3:
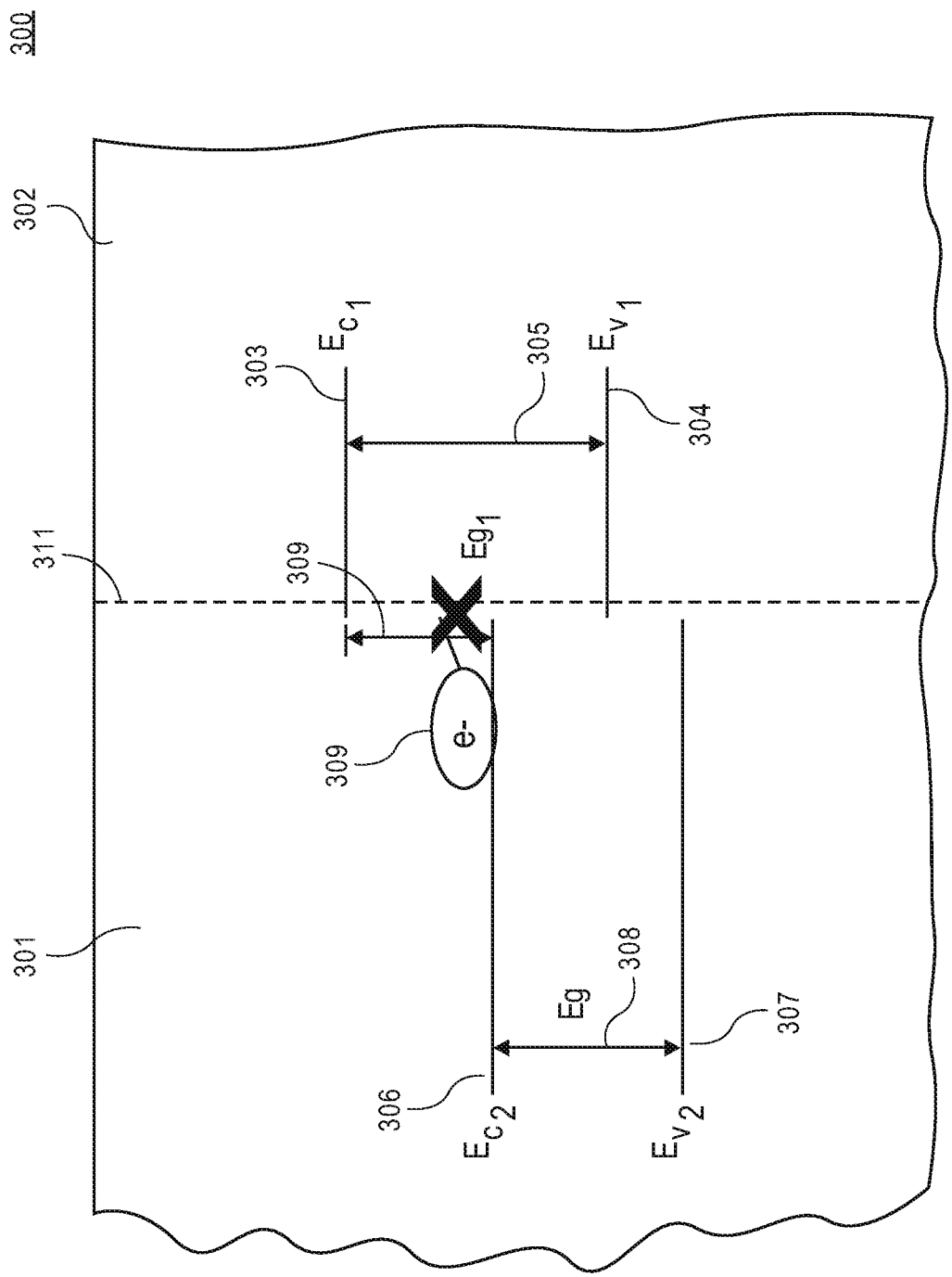
FIG. 3 is a view illustrating an energy band diagram at an interface between a fin layer and a subfin layer according to one embodiment.

FIG. 3 is a view 300 illustrating an energy band diagram at an interface 311 between a fin layer 301 and a subfin layer 302 according to one embodiment. In one embodiment, fin layer 301 represents fin layer 104 and subfin layer 302 represents subfin layer 103. As shown in FIG. 3, fin layer 301 has a conduction energy band $E_{c2}$ 306 and a valence band $E_{v2}$ 307 that are separated by a bandgap Eg 308. Subfin layer 302 has a conduction energy band $E_{c1}$ 303 and a valence band $E_{v1}$ 304 that are separated by a bandgap Eg 305. In one embodiment, bandgap Eg 305 is greater than bandgap 308 so that a heterojunction is generated at interface 311, as shown in FIG. 3. In another embodiment, bandgap Eg 305 is not greater than bandgap 308. As shown in FIG. 3, at interface 311 conduction band 303 is offset relative to conduction band 306 by a conductive band offset 309. The conduction band offset 309 represents an energy barrier for electrons 309 of the conduction band 306 that prevents the electrons of the fin layer 301 from travelling to subfin layer 302 when no voltage is applied at the heterojunction. In one embodiment, the heterojunction at interface 311 is a type 2 heterojunction that has conduction band offset 309 and a valence band offset between valence band 304 and valence band 307, as shown in FIG. 3.

Referring back to FIG. 1C, fin layer 104 has a bandgap between the conduction band and the valence band that is smaller than that of the subfin layer 103. In one embodiment, the conduction band energy offset of the subfin layer 103 relative to the fin layer 104 is at least 0.2 electron volts (eV). In more specific embodiment, the conduction band energy offset of the subfin layer 103 relative to the fin layer 103 is from about 0.2 eV to about 0.4 eV.

In one embodiment, fin layer 104 is a group IV semiconductor material layer. In one embodiment, fin layer 104 comprises Si, Ge, SiGe, carbon, other group IV semiconductor material, or any combination thereof. In one embodiment, fin layer 104 is an n-type group IV semiconductor layer. In one embodiment, fin layer 104 is an n-type Ge layer. In another embodiment, fin layer 104 is an n-type Si layer. In yet another embodiment, fin layer 104 is an n-type SiGe layer. In one embodiment, the subfin layer 103 is a silicon germanium carbon layer and fin layer 104 is an n-type germanium layer.

In another embodiment, the fin layer 104 comprises a III-V material, GaAs, InP, GaP, InGaAs, InAsSb, InGaAs, or other III-V material. Generally, using non-group IV materials (e.g., III-V materials) that have a bandgap greater than a bandgap of the n-type group IV material fin may be not as beneficial as using a wide bandgap group IV material for the subfin layer, as elements from the non-group IV material subfin layer may diffuse into the n-type group IV material fin and act as additional n-type dopants in the n-type fin that may degrade performance of the transistor.

Using the group IV material subfin that has a conduction band energy offset relative to the n-type group IV material fin sufficient enough to prevent the electrons from travelling into the subfin layer eliminates a parasitic leakage current in the NMOS Ge transistor. The group IV material subfin that has a conduction band energy offset relative to the n-type group IV material fin to suppress a parasitic leakage current beneficially eliminates the band-to-band tunneling issues of the conventional subfin doping techniques. In one embodiment, the thickness of the fin layer 104 is determined by design. In one embodiment, the fin layer 104 is a multilayer stack comprising at least two layers. In one embodiment, the fin layer 104 comprises a nanowire. In one embodiment, the thickness of the fin layer 104 is at least about 5 nm. In one embodiment, the thickness of the fin layer 104 is from about 5 nm to about 500 nm.

In an embodiment, fin layer 104 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other deposition techniques known to one of ordinary skill in the art of microelectronic device manufacturing.

Figure 1D:
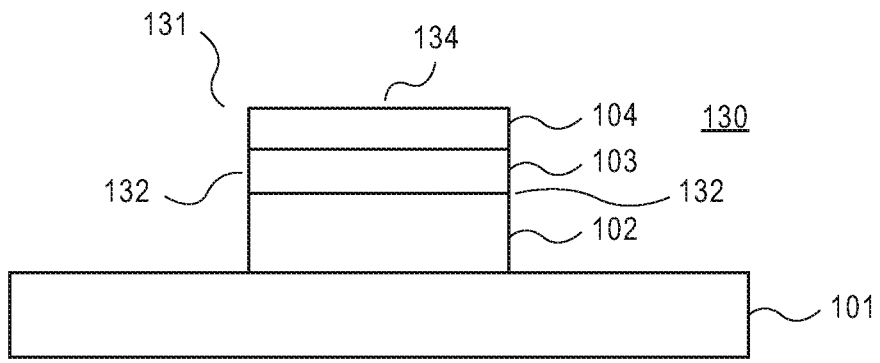
FIG. 1D is a view similar to FIG. 1C after the fin layer is etched to form a device fin according to one embodiment.

FIG. 1D is a view 130 similar to FIG. 1C after fin layer 104 is etched to form a device fin 131 according to one embodiment. As shown in FIG. 1D, fin layer 104 is etched to form device fin 131. Device fin 131 comprises a top portion 134 and opposing sidewalls 132 and 133. In one embodiment, fin layer 104 is etched to a predetermined depth (e.g., down to subfin layer 103, or to other depth) to form device fin 131. In one embodiment, fin layer 104 and subfin layer 103 are etched down to buffer layer to form device fin 131. In yet another embodiment, fin layer 104, subfin layer 103 and buffer layer 102 are etched down to substrate 101 to form device fin 131, as shown in FIG. 1D.

In one embodiment, device fin 131 is formed using one or more fin patterning and etching techniques known to one of ordinary skill in the art of microelectronic device manufacturing. In one embodiment, the width of the device fin 131 between the sidewalls 132 is determined by design. In one embodiment, the width of the device fin 131 is from about 2 nm to about 100 nm. In one embodiment, the height of the device fin 131 is determined by design.

In one embodiment, an insulating layer (not shown) is deposited on the exposed portions of the substrate 101 to a predetermined thickness adjacent to sidewalls of the device fin 131 to insulate one device fin from another device fin. In this embodiment, the insulating layer is deposited on substrate 101 using one of insulating layer deposition techniques, such as but not limited to a chemical vapour deposition ("CVD"), a physical vapour deposition ("PVD"), molecular beam epitaxy ("MBE"), metalorganic chemical vapor deposition ("MOCVD"), atomic layer deposition ("ALD"), spin-on, or other deposition techniques known to one of ordinary skill in the art of microelectronic device manufacturing.

Figure 2A:
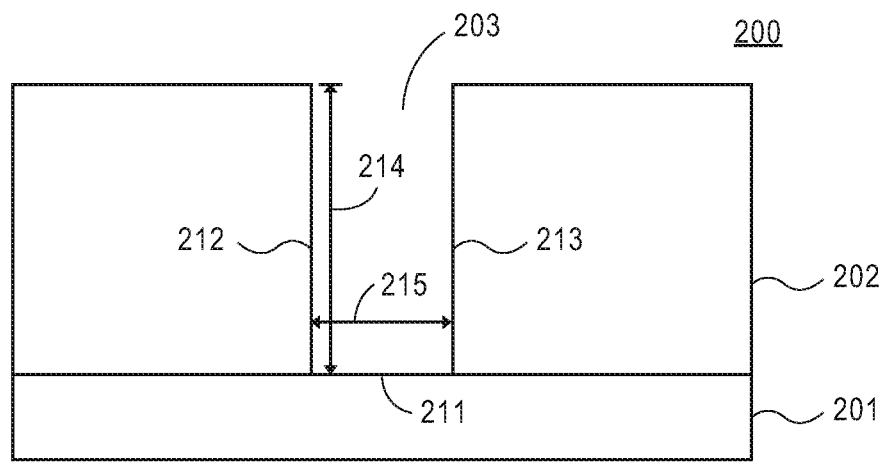
FIG. 2A shows a cross-sectional view of an electronic device structure according to one embodiment.

FIG. 2A shows a cross-sectional view 200 of an electronic device structure according to one embodiment. An insulating layer 202 is deposited on a substrate 201, as shown in FIG. 2A. A trench 203 is formed in the insulating layer 202 to expose a portion of substrate 201, as shown in FIG. 2A. In at least some embodiments, trench 203 represents one of a plurality of trenches that are formed on substrate 201.

As shown in FIG. 2A, trench 203 has a bottom 211 and opposing sidewalls 212 and 213. In one embodiment, bottom 211 is the exposed portion of the substrate 201. Trench 203 has a depth D 214 and a width W 215. In one embodiment, depth 214 is determined by the thickness of the insulating layer 202. In an embodiment, the width of the trench is determined by the width of the electronic device. The electronic device can be for example a fin based transistor architecture (e.g., FinFET, Trigate, GAA, a nanowire based device, a nanoribbons based device, or any other electronic device). In one embodiment, the width of the trench 203 is from about 5 nm to about 300 nm. In an embodiment, the aspect ratio of the trench (D/W) is at least 1.5.

In one embodiment, the substrate 201 represents one of the substrates described above with respect to substrate 101. Insulating layer 202 can be any material suitable to insulate adjacent devices and prevent leakage. In one embodiment, electrically insulating layer 202 is an oxide layer, e.g., silicon dioxide, or any other electrically insulating layer determined by an electronic device design. In one embodiment, insulating layer 202 comprises an interlayer dielectric (ILD). In one embodiment, insulating layer 102 is a low-k dielectric that includes, but is not limited to, materials such as, e.g., silicon dioxide, silicon oxide, carbon doped oxide ("CDO"), e.g., carbon doped silicon dioxide, porous silicon dioxide, silicon nitride, or any combination thereof. In one embodiment, insulating layer 102 includes a dielectric material having k-value less than 5. In one embodiment, insulating layer 102 includes a dielectric material having k-value less than 2. In at least some embodiments, insulating layer 202 includes a nitride, oxide, a polymer, phosphosilicate glass, fluorosilicate (SiOF) glass, organosilicate glass (SiOCH), other electrically insulating layer determined by an electronic device design, or any combination thereof. In at least some embodiments, insulating layer 202 may include polyimide, epoxy, photodefinable materials, such as benzocyclobutene (BCB), and WPR-series materials, or spin-on-glass. In one embodiment, insulating layer 202 is a shallow trench isolation (STI) layer to provide field isolation regions that isolate one fin from other fins on substrate 201. In one embodiment, the thickness of the insulating layer 202 is at least 10 nm. In one embodiment, the thickness of the layer is in an approximate range from about 10 nm to about 2 microns (μm). In one embodiment, insulating layer 202 is an interlayer dielectric (ILD) layer.

In an embodiment, insulating layer 202 is deposited on substrate 201 using one of deposition techniques, such as but not limited to a chemical vapour deposition ("CVD"), a physical vapour deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing. In one embodiment, trenches, such as trench 203 are formed in the insulating layer 202 using patterning and etching techniques known to one of ordinary skill in the art of microelectronic device manufacturing.

Figure 2B:
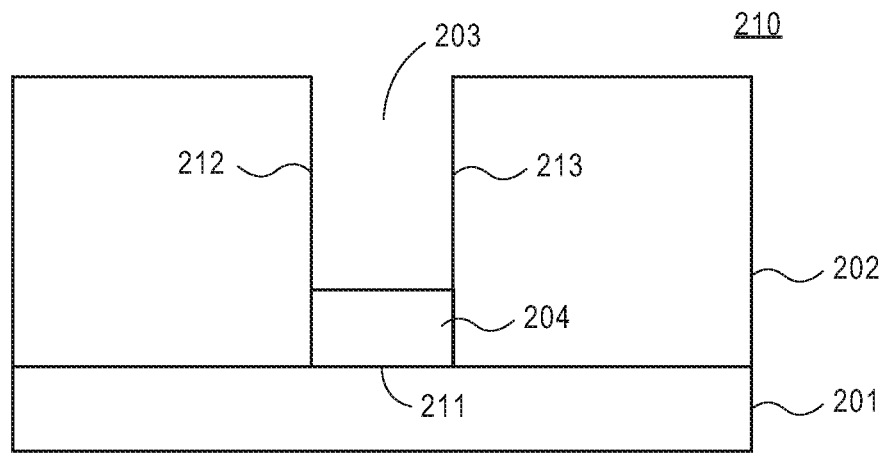
FIG. 2B is a view similar to FIG. 2A after a buffer layer is deposited onto the portion of the substrate within the trench according to one embodiment.

FIG. 2B is a view 210 similar to FIG. 2A after a buffer layer 204 is deposited onto the portion of the substrate 201 within the trench 203 according to one embodiment. Buffer layer 204 is deposited onto bottom 211 between sidewalls 212 and 213 of the trench 203, as shown in FIG. 2B. In one embodiment, an aspect ratio D/W of the trench 203 determines the thickness of the buffer layer 204. In an embodiment, the thickness of the buffer layer 204 is such that most defects originated from the lattice mismatch are trapped within the buffer layer and are prevented from being propagated into a device layer above the buffer layer 204 using an aspect ratio trapping (ART). In one embodiment, the thickness of the buffer layer 204 is substantially smaller than the thickness of the buffer layer 102. In one embodiment, the buffer layer 204 represents one of the buffer layers described above with respect to buffer layer 102.

In one embodiment, buffer layer 204 has the sufficient thickness that most defects present at the bottom 211 do not reach the top surface of the buffer layer 204. In one embodiment, the thickness of the buffer layer 204 deposited in the trench is substantially smaller than the thickness of the buffer layer 102. In one embodiment, the thickness of the buffer layer 204 is at least about 5 nm. In one embodiment, the thickness of the buffer layer 204 is from about 5 nm to about 500 nm.

In at least some embodiments, buffer layer 204 is deposited through trench 203 onto the exposed portion of substrate 201 using a selective area epitaxy. In at least some embodiments, epitaxial buffer layer 204 is locally grown to a predetermined thickness on the exposed portion of substrate 201 through trench 203. Epitaxial buffer layer 204 can be selectively deposited using one of epitaxial techniques known to one of ordinary skill in the art of microelectronic device manufacturing, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), or other epitaxial growth technique.

Figure 2C:
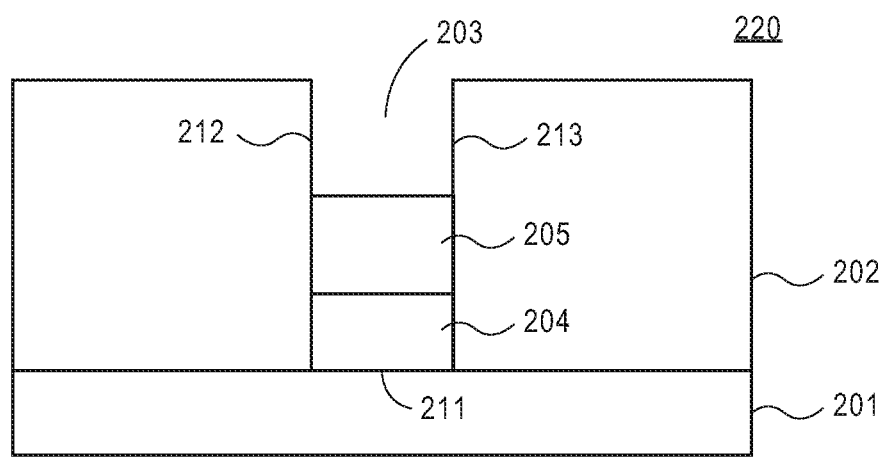
FIG. 2C is a view similar to FIG. 2B after a subfin layer is deposited on the buffer layer according to one embodiment.

FIG. 2C is a view 220 similar to FIG. 2B after a subfin layer 205 is deposited on buffer layer 204 according to one embodiment. As shown in FIG. 2C, subfin layer 205 is deposited onto the top surface of the buffer layer 204 between sidewalls 212 and 213 of the trench 203. In at least some embodiments, the buffer layer is not deposited into the trench 203, and subfin layer 205 is deposited directly onto the bottom 211 of the trench 203.

In one embodiment, subfin layer 205 has a conduction band energy offset relative to the above fin layer to cut-off a parasitic electrical current leakage. In one embodiment, subfin layer 205 has a bandgap between a conduction band and a valence band that is greater than that of the above fin layer. In one embodiment, subfin layer 205 represents one of the subfin layers described above with respect to subfin layer 103.

In one embodiment, the subfin layer 205 is a group IV semiconductor material layer. In one embodiment, the subfin layer 205 comprises carbon (C). In one embodiment, the subfin layer 103 comprises silicon germanium carbon (SiGeC), silicon carbide (e.g., SiC, 3C—SiC), or any combination thereof. In one embodiment, the subfin layer 205 comprises a carbon doped SiGe. In one embodiment, the subfin layer 205 comprises a $Si_{1-x-y} Ge_x C_y$ alloy. In one specific embodiment, the subfin layer 205 is a $Si_{1-x-y} Ge_x C_y$ alloy, where x is any number from 0 to 1; and y is greater than about 0.01, so that the subfin layer 205 can be SiC or GeC. In more specific embodiment, the subfin layer 205 is a $Si_{1-x-y} Ge_x C_y$ alloy, where x is from about 0.7 to about 0.9; and y is from about 0.01 to about 0.03.

In one embodiment, the subfin layer 205 comprises at least 1 weight percent (wt %) of carbon. In one embodiment, the subfin layer 205 comprises from about 1 wt % to about 5 wt % of carbon. In one embodiment, the carbon content of the $Si_{1-x-y} Ge_x C_y$ of the subfin layer 205 increases from a first carbon content at the interface with the buffer layer 102 to a second carbon content at the interface with the above fin layer. In one embodiment, the $Si_{1-x-y} Ge_x C_y$ of the subfin layer 205 has about 2 wt % of carbon at least at the interface with the fin layer.

In another embodiment, the subfin layer 205 comprises a III-V material. In alternative embodiments, the subfin layer 205 comprises a binary III-V material, e.g. gallium arsenide (GaAs), gallium phosphide (GaP), aluminum arsenide (AlAs), aluminum phosphide (AlP), a ternary material III-V, e.g. aluminum arsenic antimonide (AlAsSb), indium gallium arsenide (InGaAs), a quaternary III-V material, e.g. aluminum gallium indium phosphide (AlInGaP) or other III-V material alloys.

In one embodiment, the thickness of the subfin layer 205 is sufficient enough to prevent tunneling of the electrical current carriers (e.g., electrons, holes) through the subfin layer 205. In one embodiment, the greater the conduction band energy offset of the subfin layer 205 relative to the fin layer deposited thereon the smaller the thickness of the subfin layer 205. In one embodiment, the thickness of the subfin layer 205 is at least about 5 nanometers (nm). In one embodiment, the thickness of the subfin layer 205 is from about 5 nm to about 200 nm. In more specific embodiment, the thickness of the subfin layer 205 is from about 10 nm to about 20 nm.

In at least some embodiments, subfin layer 205 is deposited using a selective area epitaxy. In at least some embodiments, subfin layer 205 is locally grown on the buffer layer 205 to a predetermined thickness through trench 203. In at least some other embodiments, subfin layer 205 is locally directly grown on the bottom 211 of the trench 203 to a predetermined thickness. Subfin layer 205 can be selectively deposited using one of epitaxial techniques known to one of ordinary skill in the art of microelectronic device manufacturing, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), or other deposition techniques known to one of ordinary skill in the art of microelectronic device manufacturing.

Figure 2D:
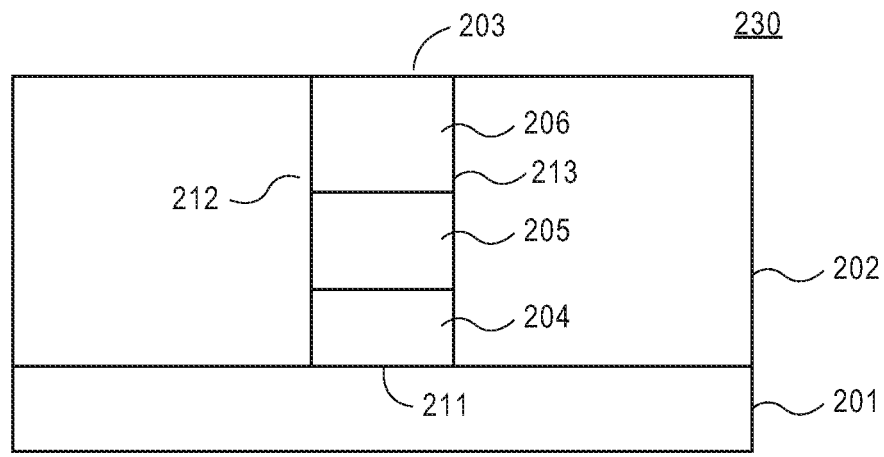
FIG. 2D is a view similar to FIG. 2C after a fin layer is deposited on the subfin layer within the trench according to one embodiment.

FIG. 2D is a view 230 similar to FIG. 2C after a fin layer 206 is deposited on subfin layer 205 within the trench 203 according to one embodiment. In one embodiment, subfin layer 205 has a conduction band energy offset relative to the fin layer 206 to prevent a parasitic electrical current leakage into the subfin layer 205. In one embodiment, fin layer 206 has a bandgap between a conduction band and a valence band that is smaller than that of the subfin layer 205. In one embodiment, the conduction band energy offset of the subfin layer 205 relative to the fin layer 206 is at least 0.2 electron volts (eV). In more specific embodiment, the conduction band energy offset of the subfin layer 205 relative to the fin layer 206 is from about 0.2 eV to about 0.4 eV. In one embodiment, fin layer 206 represents one of the fin layers described above with respect to fin layer 104.

In one embodiment, fin layer 206 is a group IV semiconductor material layer. In one embodiment, fin layer 206 comprises Si, Ge, SiGe, carbon, other group IV semiconductor material, or any combination thereof. In one embodiment, fin layer 206 is an n-type group IV semiconductor layer. In one embodiment, fin layer 206 is an n-type Ge layer.

In another embodiment, fin layer 206 is an n-type Si layer. In yet another embodiment, fin layer 206 is an n-type SiGe layer. In one embodiment, the subfin layer 206 is a silicon germanium carbon layer and fin layer 205 is an n-type germanium layer. In another embodiment, the fin layer 206 comprises a III-V material, GaAs, InP, GaP, InGaAs, InAsSb, InGaAs, or other III-V material.

In one embodiment, the thickness of the fin layer 206 is determined by design. In one embodiment, the fin layer 206 is a multilayer stack comprising at least two layers. In one embodiment, the fin layer 206 comprises a nanowire. In one embodiment, the thickness of the fin layer 206 is at least about 5 nm. In one embodiment, the thickness of the fin layer 206 is from about 10 nm to about 500 nm.

In at least some embodiments, fin layer 206 is deposited using a selective area epitaxy. In at least some embodiments, fin layer 206 is locally grown on the subfin layer 205 to a predetermined thickness through trench 203. Fin layer 206 can be selectively deposited using one of epitaxial techniques known to one of ordinary skill in the art of microelectronic device manufacturing, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), or other deposition techniques known to one of ordinary skill in the art of microelectronic device manufacturing.

Figure 2E:
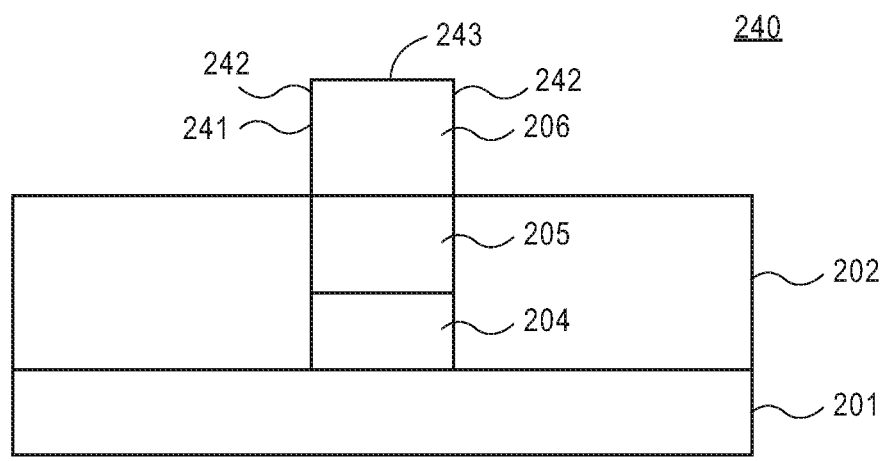
FIG. 2E is a view similar to FIG. 2D after the insulating layer is recessed to form a device fin according to one embodiment.
Figure 4:
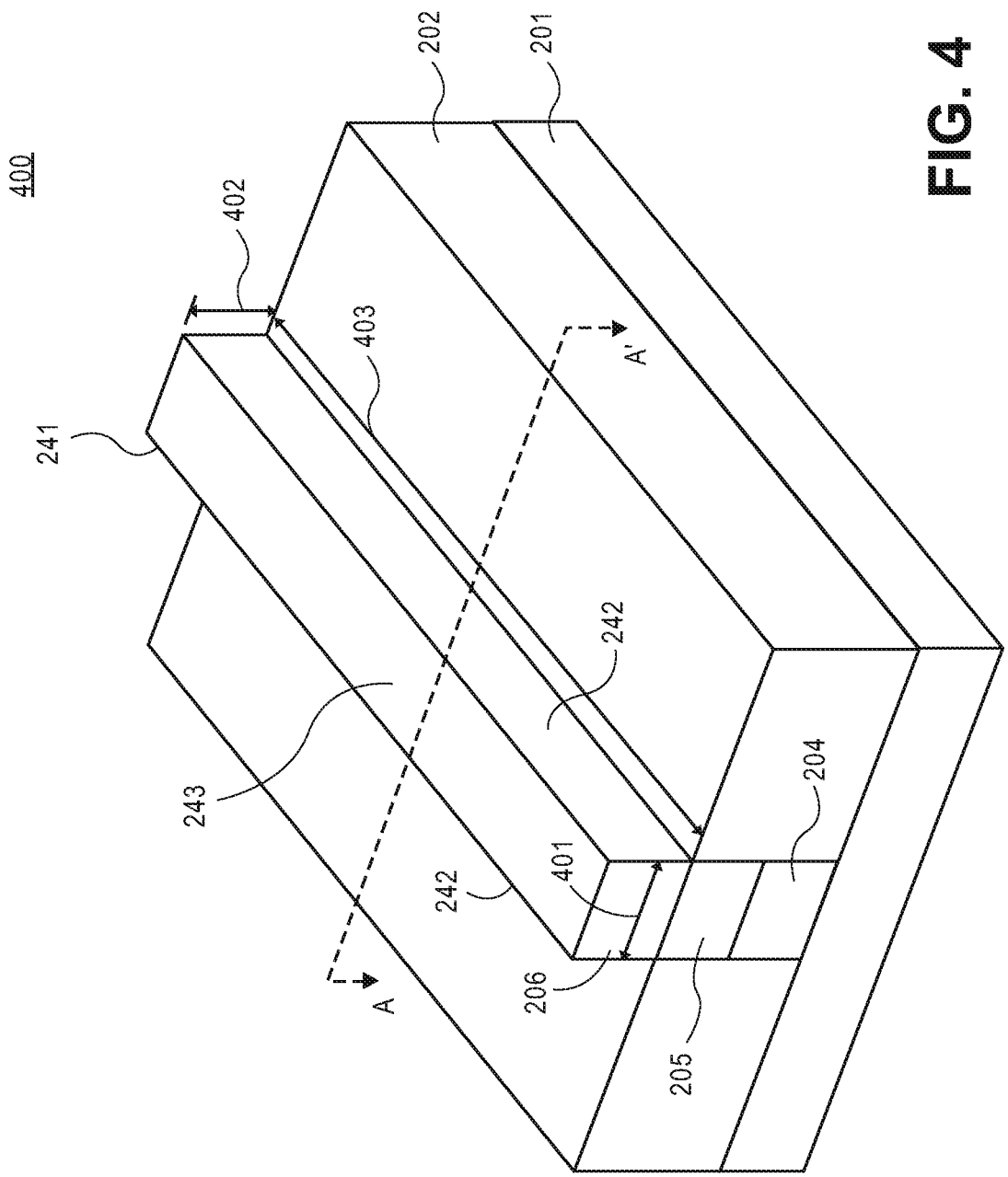
FIG. 4 is a perspective view of the electronic device structure shown in FIG. 2E according to one embodiment.

FIG. 2E is a view 240 similar to FIG. 2D after the insulating layer 202 is recessed to form a device fin 241 according to one embodiment. FIG. 4 is a perspective view 400 of the electronic device structure shown in FIG. 2E according to one embodiment. View 240 is a cross-sectional view along an axis A-A' depicted in FIG. 4. As shown in FIGS. 2E and 4, device fin 241 is a portion of the fin layer 206 that protrudes from a top surface of insulating layer 202. Device fin 241 comprises a top portion 243 and opposing sidewalls 242. As shown in FIG. 4, device fin 241 has a width 401, height 402 and a length 403. Length 403 is substantially greater than the width 401, as shown in FIG. 4. As shown in FIGS. 2E and 4, insulating layer 202 is recessed down to a predetermined depth that defines the height of the device fin 241 relative to a top surface of the insulation layer 202. The height and the width of the fin 241 are typically determined by a design. In an embodiment, the height 402 is from about 10 nm to about 100 nm and the width 401 is from about 5 nm to about 20 nm.

In one embodiment, forming device fin 241 involves depositing a patterned hard mask (not shown) onto fin layer 206 and then recessing insulating layer 202 to a predetermined depth. In one embodiment, insulating layer 202 is recessed by a selective etching technique, such as but not limited to a wet etching, a dry etching, or any combination thereof techniques using a chemistry that has substantially high selectivity to the fin material. In one embodiment, a ratio of the etching rates of the insulating layer 202 to the fin material is at least 10:1. In one embodiment, after recessing the insulating layer 202, the patterned hard mask is removed by a chemical mechanical polishing (CMP) process as known to one of ordinary skill in the art of microelectronic device manufacturing.

In another embodiment, forming device fin 241 involves depositing an insulating layer to a predetermined thickness adjacent to portions of sidewalls of the fin stack on the substrate as described above with respect to FIG. 1D. For this embodiment, substrate 201 represents substrate 101, buffer layer 204 represents buffer layer 102, subfin layer 205 represents subfin layer 103 and fin layer 206 represents fin layer 104.

Figure 2F:
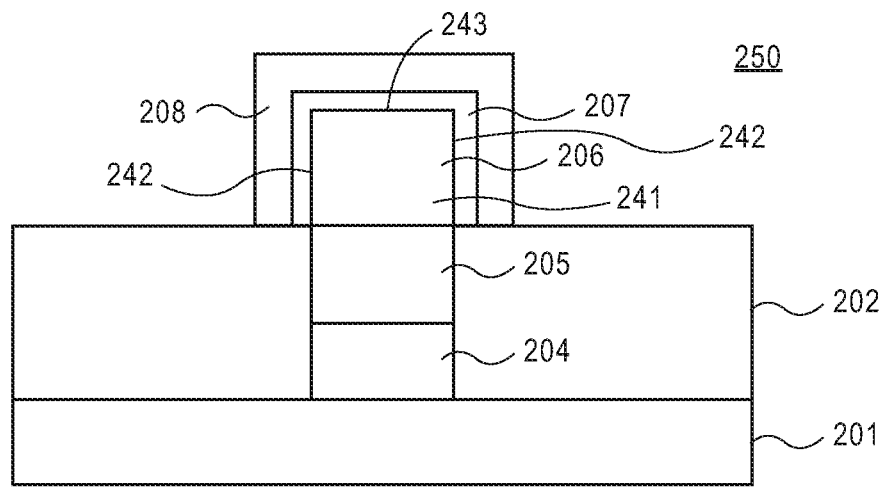
FIG. 2F is a view similar to FIG. 2E after a gate electrode layer on a gate dielectric layer is deposited on the device fin according to one embodiment.
Figure 5:
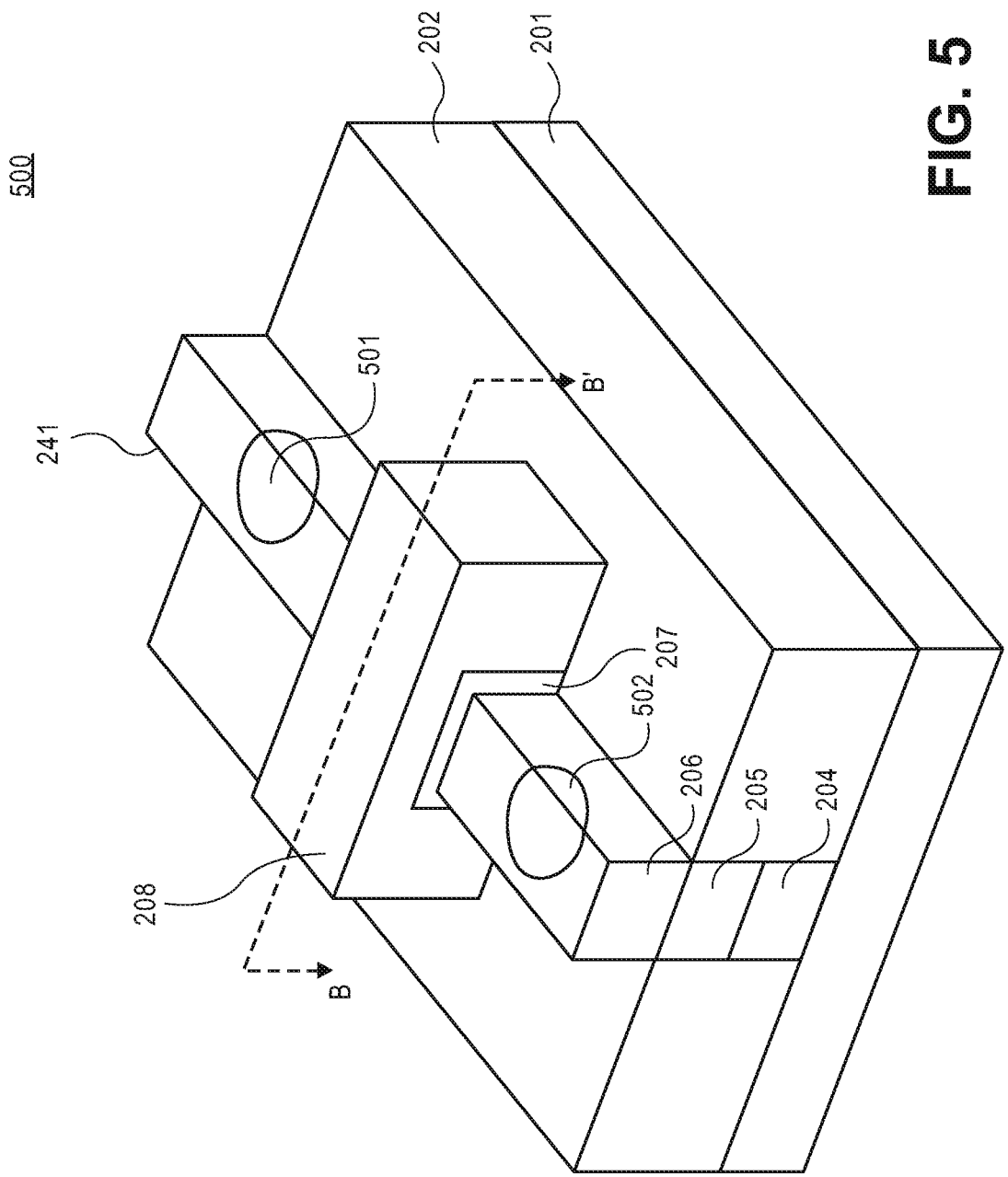
FIG. 5 is a perspective view of the electronic device structure depicted in FIG. 2F according to one embodiment.

FIG. 2F is a view 250 similar to FIG. 2E after a gate electrode layer 208 on a gate dielectric layer 207 is deposited on the device fin 241 according to one embodiment. 6 View 250 is a cross-sectional view along an axis B-B' depicted in FIG. 5. As shown in FIGS. 2F and 5, gate dielectric layer 207 is deposited on top portion 243 and opposing sidewalls 242 of the device fin 241. Gate electrode layer 208 is deposited on gate dielectric layer 207. In one embodiment, gate dielectric layer 207 is a high-k dielectric material having a dielectric constant greater than the dielectric constant of silicon dioxide. In one embodiment, gate dielectric layer 207 comprises a high-k dielectric material, such as a metal oxide dielectric. For example, gate dielectric layer 207 can be but not limited to tantalum silicon oxide (TaSiOx); pentaoxide ($Ta_2 O_5$), and titanium oxide ($TiO_2$) zirconium oxide ($ZrO_2$), hafnium oxide ($HfO_2$), lanthanum oxide ($La_2O_4$), lead zirconium titanate (PZT), other high-k dielectric material, or a combination thereof. In an embodiment, the gate dielectric layer 207 is a silicon dioxide ($SiO_2$), silicon oxynitride ($SiO_x N_y$) or a silicon nitride ($Si_3 N_4$) dielectric layer. In an embodiment, the thickness of the gate dielectric layer 207 is in an approximate range from about 1 nm to about 20 nm, and more specifically, between about 5 nm to about 10 nm.

As shown in FIGS. 2F and 5, gate electrode layer 208 is formed on and around the gate dielectric layer 207. As shown in FIGS. 2F and 5, gate electrode layer 208 has a top portion and laterally opposite sidewalls separated by a distance which defines the length of the channel of the fin device. Gate electrode 208 can be formed of any suitable gate electrode material. In an embodiment, the gate electrode 208 is a metal gate electrode, such as but not limited to, tungsten, tantalum, titanium, and their nitrides. It is to be appreciated, the gate electrode 208 need not necessarily be a single material and can be a composite stack of thin films, such as but not limited to a polycrystalline silicon/metal electrode or a metal/polycrystalline silicon electrode.

In at least some embodiments, the gate dielectric layer 207 is deposited using one of gate dielectric layer deposition techniques, such as but not limited to a chemical vapour deposition ("CVD"), a physical vapour deposition ("PVD"), molecular beam epitaxy ("MBE"), metalorganic chemical vapor deposition ("MOCVD"), atomic layer deposition ("ALD"), spin-on, or other deposition techniques known to one of ordinary skill in the art of microelectronic device manufacturing.

In at least some embodiments, the gate electrode layer 208 is deposited using one of gate electrode deposition techniques known to one of ordinary skill in the art of microelectronic device manufacturing. A source region 501 and a drain region 502 are formed at opposite sides of the gate electrode 208 in a device fin 241. The source and drain regions are formed of the same conductivity type such as N-type or P-type conductivity. In an embodiment, the source and drain regions have a doping concentration of between $1 \times 10^{19}$, and $1 \times 10^{21}$ atoms/cm3. The source and drain regions can be formed of uniform concentration or can include sub-regions of different concentrations or doping profiles such as tip regions (e.g., source/drain extensions). In an embodiment, the source and drain regions have the same doping concentration and profile. In an embodiment, the doping concentration and profile of the source and drain regions, such as source region 104 and drain region 106 can vary in to obtain a particular electrical characteristic. The portion of the fin 241 located between the source region and drain regions, defines a channel region of the transistor.

The channel region can also be defined as the area of the semiconductor fin 241 surrounded by the gate electrode 208. At times however, the source/drain region may extend slightly beneath the gate electrode through, for example, diffusion to define a channel region slightly smaller than the gate electrode length (Lg). In an embodiment, the channel region is intrinsic or undoped. In an embodiment, the channel region is doped, for example to a conductivity level of between $1\times10^{16}$ to $1\times10^{19}$ atoms/cm$^3$. In an embodiment, when the channel region is doped it is typically doped to the opposite conductivity type of the source/drain region. For example, when the source and drain regions are N-type conductivity the channel region would be doped to a p type conductivity. Similarly, when the source and drain regions are P type conductivity the channel region would be N-type conductivity. In this manner a tri-gate transistor can be formed into either a NMOS transistor or a PMOS transistor respectively.

Channel regions can be uniformly doped or can be doped non-uniformly or with differing concentrations to provide particular electrical and performance characteristics. For example, channel regions can include halo regions, if desired. As shown in FIGS. 2F and 5, the tri-gate transistor has gate dielectric 207 and gate electrode 208 surrounding the device fin 241 on three sides that provides three channels on the fin 241, one channel extends between the source and drain regions on one sidewall of the fin, a second channel extends between the source and drain regions on the top surface of the fin, and the third channel extends between the source and drain regions on the other sidewall of the fin.

In an embodiment, the source region 501 is electrically coupled to higher levels of metallization (e.g., metal 1, metal 2, metal 3, and so on) to electrically interconnect various transistors of the array into functional circuits. In one embodiment, the drain region 502 is coupled to higher levels of metallization (e.g., metal 1, metal 2, metal 3, and so on) to electrically interconnect various transistors of the array together into functional circuits.

Figure 6:
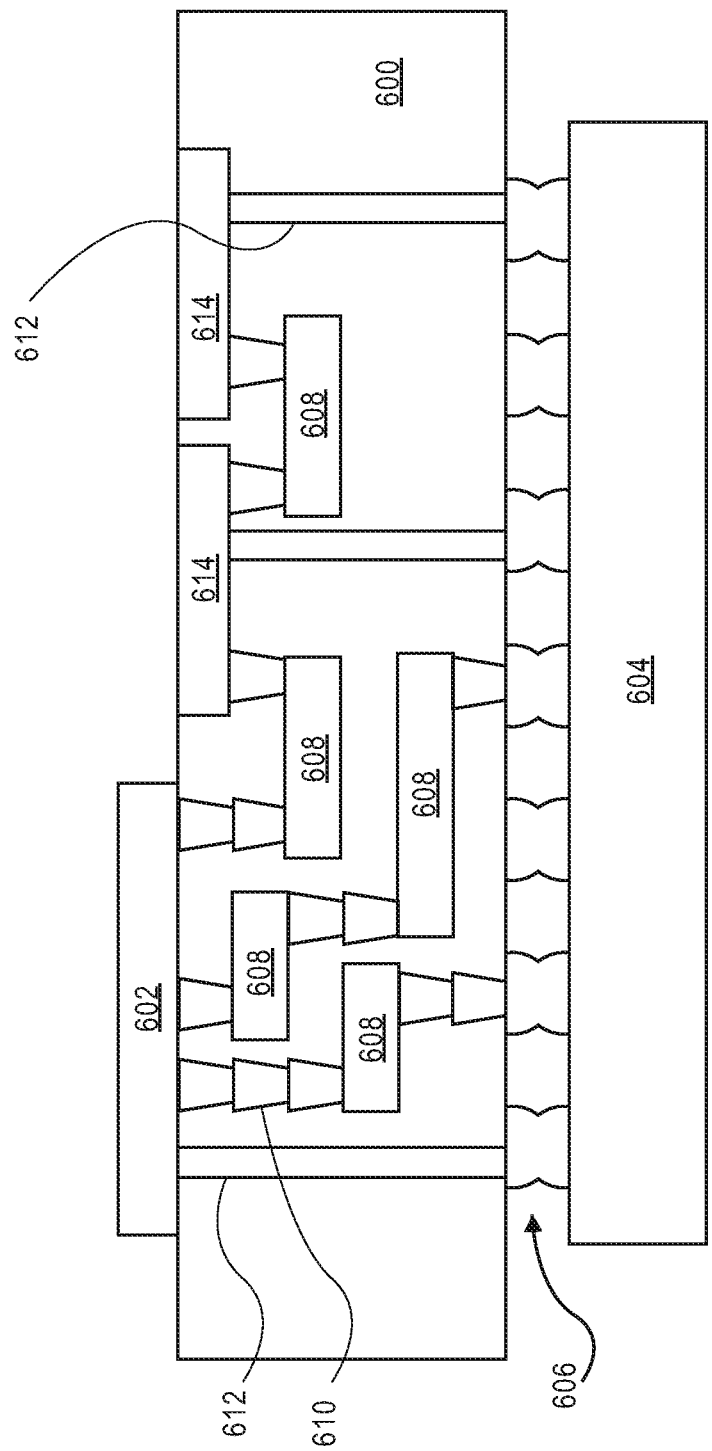
FIG. 6 illustrates an interposer that includes one or more embodiments of the invention.

FIG. 6 illustrates an interposer 600 that includes one or more embodiments of the invention. The interposer 600 is an intervening substrate used to bridge a first substrate 602 to a second substrate 604. The first substrate 602 may be, for instance, an integrated circuit die that includes one or more transistor devices having a wide bandgap subfin to reduce leakage as described herein. The second substrate 604 may be, for instance, a memory module, a computer motherboard, or another integrated circuit die includes one or more transistor devices having a wide bandgap subfin to reduce leakage as described herein. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608, vias 610, through-silicon vias (TSVs) 612. The interposer 600 may further include embedded devices 614, including passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the invention, apparatuses or processes disclosed herein may be used in the fabrication of interposer 600.

Figure 7:
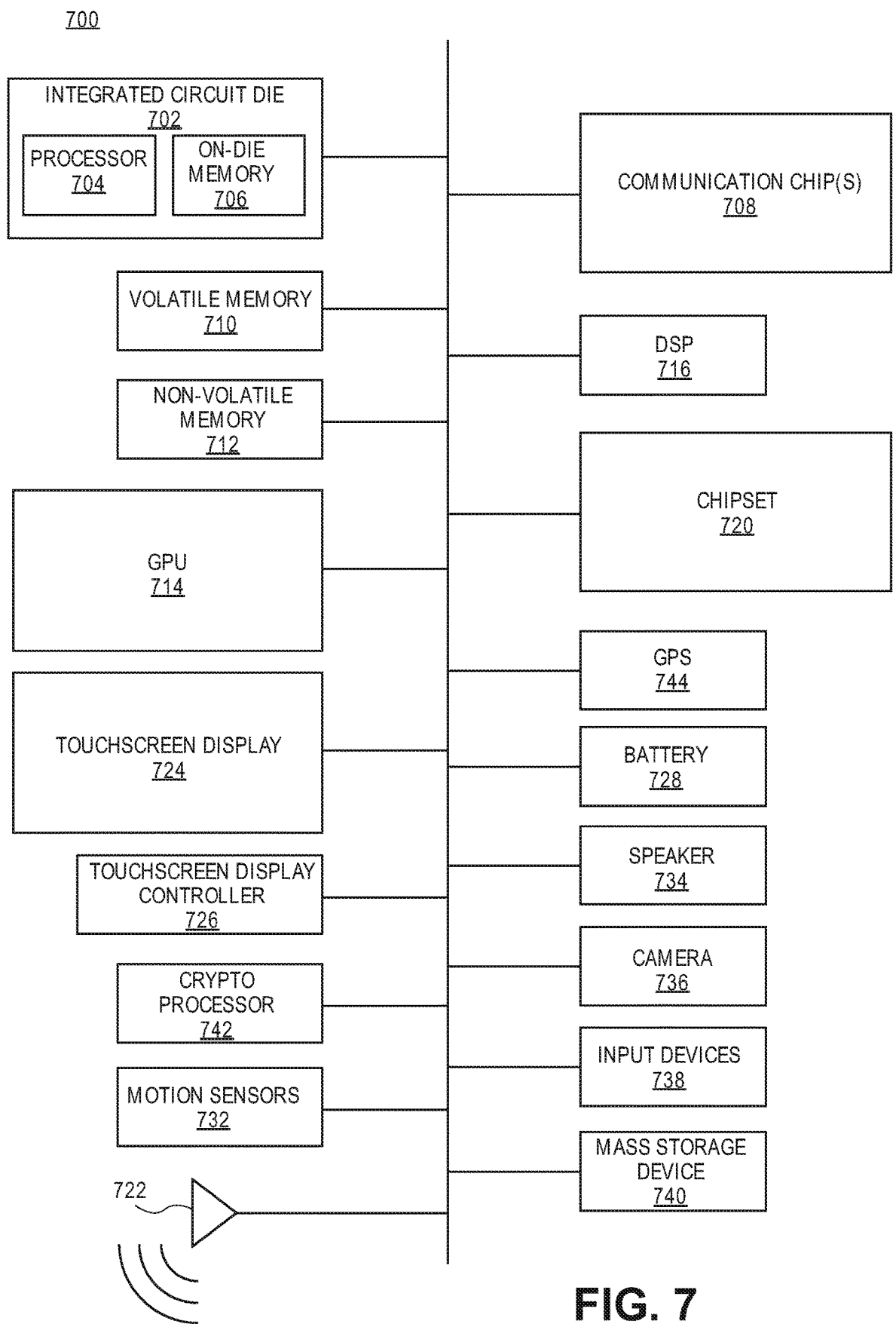
FIG. 7 illustrates a computing device in accordance with one embodiment of the invention.

FIG. 7 illustrates a computing device 700 in accordance with one embodiment of the invention. The computing device 700 may include a number of components. In one embodiment, these components are attached to one or more motherboards. In an alternate embodiment, these components are fabricated onto a single system-on-a-chip (SoC) die rather than a motherboard. The components in the computing device 700 include, but are not limited to, an integrated circuit die 702 and at least one communication chip 708. In some implementations the communication chip 708 is fabricated as part of the integrated circuit die 702. The integrated circuit die 702 may include a processor 704 such as a central processing unit (CPU), an on-die memory 706, often used as cache memory, that can be provided by technologies such as embedded DRAM (eDRAM) or spin-transfer torque memory (STTM or STTM-RAM).

Computing device 700 may include other components that may or may not be physically and electrically coupled to the motherboard or fabricated within an SoC die. These other components include, but are not limited to, a volatile memory 710 (e.g., DRAM), a non-volatile memory 712 (e.g., ROM or flash memory), a graphics processing unit 714 (GPU), a digital signal processor 716 (DSP), a crypto processor 742 (a specialized processor that executes cryptographic algorithms within hardware), a chipset 720, an antenna 722, a display or a touchscreen display 724, a touchscreen display controller 726, a battery 728 or other power source, a global positioning system (GPS) device 744, a power amplifier (PA), a compass, a motion coprocessor or sensors 732 (that may include an accelerometer, a gyroscope, and a compass), a speaker 734, a camera 736, user input devices 738 (such as a keyboard, mouse, stylus, and touchpad), and a mass storage device 740 (such as hard disk drive, compact disk (CD), digital versatile disk (DVD), and so forth).

The communication chip 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 708. For instance, a first communication chip 708 may be dedicated to shorter range wireless communications such as Wi-Fi and Bluetooth and a second communication chip 708 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. One or more components (e.g., integrated circuit die 702, communication chip 708, GPU 714, cryptoprocessor 742, DSP 716, chipset 720), and other components may include one or more wide bandgap subfins formed in accordance with embodiments of the invention. In further embodiments, another component housed within the computing device 700 may contain one or more wide bandgap subfins formed in accordance with embodiments of the invention.

In various embodiments, the computing device 700 may be a laptop computer, a netbook computer, a notebook computer, an ultrabook computer, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

The above description of illustrative implementations of the invention, including what is described in the Abstract, is not intended to be exhaustive or to limit embodiments of the invention to the precise forms disclosed. While specific implementations of, and examples for the invention are described herein for illustrative purposes, various equivalent modifications are possible within the scope of embodiments of the invention, as those skilled in the relevant art will recognize.

These modifications may be made to embodiments of the invention in light of the above detailed description. The terms used in the following claims should not be construed to limit embodiments of the invention to the specific implementations disclosed in the specification and the claims. Rather, the scope of embodiments of the invention is to be determined entirely by the following claims, which are to be construed in accordance with established doctrines of claim interpretation.

The following examples pertain to further embodiments:

In Example 1, an apparatus comprises a subfin layer on a substrate; a fin layer on the subfin layer, the subfin layer having a conduction band energy offset relative to the fin layer to prevent a leakage in the subfin layer.

In Example 2 the subject matter of Example 1 can optionally include that the conduction band energy offset is at least 0.2 eV.

In Example 3, the subject matter of any of Examples 1-2 can optionally include that the subfin layer has a bandgap greater than that of the fin layer.

In Example 4, the subject matter of any of Examples 1-3 can optionally include that the subfin layer comprises a group IV material semiconductor.

In Example 5, the subject matter of any of Examples 1-4 can optionally include that the subfin layer comprises a III-V material semiconductor.

In Example 6, the subject matter of any of Examples 1-5 can optionally include that the subfin layer comprises carbon.

In Example 7, the subject matter of any of Examples 1-6 can optionally include that the fin layer comprises an n-type group IV semiconductor.

In Example 8, the subject matter of any of Examples 1-7 can optionally include an insulating layer on a substrate; a trench in the insulating layer, wherein the fin layer on the subfin layer are deposited within the trench.

In Example 9, the subject matter of any of Examples 1-8 can optionally include a gate dielectric layer on the fin layer; a gate electrode layer on the gate dielectric layer; and source/drain regions on portions of the fin layer.

In Example 10, the subject matter of any of Examples 1-9 can optionally include that the subfin layer is a subfin having opposing sidewalls.

In Example 11, the subject matter of any of Examples 1-10 can optionally include that the fin layer is a fin having opposing sidewalls.

In Example 12, the subject matter of any of Examples 1-11 can optionally include a buffer layer between the substrate and the subfin layer.

In Example 13, an electronic device to prevent a leakage comprises a subfin layer on a substrate; a fin layer on the subfin layer, the subfin layer comprising a first group IV semiconductor material layer that has a bandgap greater than a bandgap of the fin layer to prevent the subfin layer leakage.

In Example 14, the subject matter of Example 13 can optionally include that the subfin layer has a conduction band energy offset of to the fin layer of at least 0.2 eV.

In Example 15, the subject matter of any of Examples 13-14 can optionally include that the first group IV semiconductor material layer comprises carbon.

In Example 16, the subject matter of any of Examples 13-15 can optionally include that the fin layer comprises a second group IV semiconductor material layer.

In Example 17, the subject matter of any of Examples 13-16 can optionally include a gate dielectric layer on the fin layer; a gate electrode layer on the gate dielectric layer; and source/drain regions on portions of the fin layer.

In Example 18, the subject matter of any of Examples 13-17 can optionally include that the subfin layer has at least two opposing sidewalls.

In Example 19, the subject matter of any of Examples 13-18 can optionally include that the fin layer has at least two opposing sidewalls.

In Example 20, the subject matter of any of Examples 13-19 can optionally include a buffer layer between the substrate and the subfin layer.

In Example 21, the subject matter of any of Examples 13-20 can optionally include an insulating layer on a substrate; a trench in the insulating layer, wherein the fin layer on the subfin layer are deposited within the trench.

In Example 22, a method to manufacture an electronic device comprises depositing a subfin layer on a substrate; depositing a fin layer on the subfin layer, the subfin layer having a conduction band energy offset relative to the fin layer to prevent the subfin layer leakage.

In Example 23, the subject matter of Example 22 can optionally include that the conduction band energy offset is at least 0.2 eV.

In Example 24, the subject matter of any of Examples 22-23 can optionally include that the subfin layer has a bandgap greater than that of the fin layer.

In Example 25, the subject matter of any of Examples 22-24 can optionally include that the subfin layer comprises a group IV material semiconductor.

In Example 26, the subject matter of any of Examples 22-25 can optionally include that the subfin layer comprises a III-V material semiconductor.

In Example 27, the subject matter of any of Examples 22-26 can optionally include that the subfin layer comprises carbon.

In Example 28, the subject matter of any of Examples 22-27 can optionally include that the fin layer comprises an n-type group IV semiconductor.

In Example 29, the subject matter of any of Examples 22-28 can optionally include depositing an insulating layer on the substrate; forming a trench in the insulating layer, wherein the fin layer on the subfin layer are deposited within the trench.

In Example 30, the subject matter of any of Examples 22-29 can optionally include depositing a gate dielectric layer on the fin layer; depositing a gate electrode layer on the gate dielectric layer; and forming source/drain regions on portions of the fin layer.

In Example 31, the subject matter of any of Examples 22-30 can optionally include that the subfin layer is a subfin having opposing sidewalls.

In Example 32, the subject matter of any of Examples 22-31 can optionally include that the fin layer is a fin having opposing sidewalls.

In Example 33, the subject matter of any of Examples 22-32 can optionally include depositing a buffer layer between the substrate and the subfin layer.

In Example 34, a method to manufacture an electronic device to prevent a leakage comprises depositing a subfin layer on a substrate; depositing a fin layer on the subfin layer, the subfin layer comprising a first group IV semiconductor material layer that has a bandgap greater than a bandgap of the fin layer to prevent the subfin layer leakage.

In Example 35, the subject matter of Example 34 can optionally include that the subfin layer has a conduction band energy offset of to the fin layer of at least 0.2 eV.

In Example 36, the subject matter of any of Examples 34-35 can optionally include that the first group IV semiconductor material layer comprises carbon.

In Example 37, the subject matter of any of Examples 34-36 can optionally include that the fin layer comprises a second group IV semiconductor material layer.

In Example 38, the subject matter of any of Examples 34-37 can optionally include depositing a gate dielectric layer on the fin layer; depositing a gate electrode layer on the gate dielectric layer; and forming source/drain regions on portions of the fin layer.

In Example 39, the subject matter of any of Examples 34-38 can optionally include that the subfin layer has at least two opposing sidewalls.

In Example 40, the subject matter of any of Examples 34-39 can optionally include that the fin layer has at least two opposing sidewalls.

In Example 41, the subject matter of any of Examples 34-40 can optionally include depositing a buffer layer between the substrate and the subfin layer.

In Example 42, the subject matter of any of Examples 34-41 can optionally include depositing an insulating layer on a substrate; forming a trench in the insulating layer depositing a subfin layer within the trench on the substrate, wherein the fin layer on the subfin layer are deposited in the trench.

In the foregoing specification, methods and apparatuses have been described with reference to specific exemplary embodiments thereof. It will be evident that various modifications may be made thereto without departing from the broader spirit and scope of embodiments as set forth in the following claims. The specification and drawings are, accordingly, to be regarded in an illustrative sense rather than a restrictive sense.

What is claimed is:

1. An apparatus comprising
a subfin layer on a substrate, the subfin layer having a top surface, and the subfin layer having a portion comprising carbon;
a fin layer on the subfin layer, the subfin layer having a conduction band energy offset relative to the fin layer to prevent a leakage in the subfin layer, and the fin layer having a bottommost surface, the bottommost surface directly on the portion comprising carbon;
a gate dielectric layer directly on the fin layer;
a gate electrode layer on the gate dielectric layer; and
an insulating layer laterally adjacent to but not over the subfin layer, the insulating layer having a top surface, wherein the bottommost surface of the fin layer is not below the top surface of the insulating layer.

2. The apparatus of claim 1, wherein the conduction band energy offset is at least 0.2 eV.

3. The apparatus of claim 1, wherein the subfin layer has a bandgap greater than that of the fin layer.

4. The apparatus of claim 1, wherein the subfin layer comprises a group IV material semiconductor.

5. The apparatus of claim 1, further comprising source/drain regions on portions of the fin layer.

6. The apparatus of claim 1, further comprising
a buffer layer between the substrate and the subfin layer.

7. An electronic device to prevent a leakage comprising:
a subfin layer on a substrate, the subfin layer having a top surface, and the subfin layer having a portion comprising carbon;
a fin layer on the subfin layer, the subfin layer comprising a first group IV semiconductor material layer that has a bandgap greater than a bandgap of the fin layer to prevent a subfin layer leakage, and the fin layer having a bottommost surface, the bottommost surface directly on the portion comprising carbon;
a gate dielectric layer directly on the fin layer;
a gate electrode layer on the gate dielectric layer; and
an insulating layer laterally adjacent to but not over the subfin layer, the insulating layer having a top surface, wherein the bottommost surface of the fin layer is not below the top surface of the insulating layer.

8. The electronic device of claim 7, wherein the subfin layer has a conduction band energy offset of to the fin layer of at least 0.2 eV.

9. The electronic device of claim 7, wherein the fin layer comprises a second group IV semiconductor material layer.

10. The electronic device of claim 7, further comprising source/drain regions on portions of the fin layer.

11. The electronic device of claim 7, further comprising a buffer layer between the substrate and the subfin layer.

12. A method to manufacture an electronic device, comprising:
depositing a subfin layer on a substrate, the subfin layer having a top surface, and the subfin layer having a portion comprising carbon;
depositing a fin layer on the subfin layer, the subfin layer having a conduction band energy offset relative to the fin layer to prevent a subfin layer leakage, and the fin layer having a bottommost surface, the bottommost surface directly on the portion comprising carbon;

depositing a gate dielectric layer directly on the fin layer;

depositing a gate electrode layer on the gate dielectric layer; and forming an insulating layer laterally adjacent to but not over the subfin layer, the insulating layer having a top surface, wherein the bottommost surface of the fin layer is not below the top surface of the insulating layer.

13. The method of claim 12, wherein the conduction band energy offset is at least 0.2 eV.

14. The method of claim 12, wherein the subfin layer has a bandgap greater than that of the fin layer.

15. The method of claim 12, wherein the subfin layer comprises a group IV material semiconductor.

16. The method of claim 12, further comprising forming a trench in the insulating layer, wherein the fin layer on the subfin layer are deposited in the trench.

17. The method of claim 12, further comprising forming source/drain regions on portions of the fin layer.

* * * * *